United States Patent [19]

Humphrey

[11] 4,376,247

[45] Mar. 8, 1983

[54] REMOTE CURRENT SENSOR

[75] Inventor: David L. Humphrey, Warren, Ohio

[73] Assignee: General Motors Corporation, Detroit, Mich.

[21] Appl. No.: 238,377

[22] Filed: Feb. 26, 1981

[51] Int. Cl.³ .......................................... G01R 31/00
[52] U.S. Cl. ..................................... 250/227; 324/96
[58] Field of Search ...................... 324/96; 350/331 R; 250/227

[56] References Cited

U.S. PATENT DOCUMENTS 4,070,572  1/1978  Summerhayes .................. 324/96 X
4,329,580  5/1982  Riley et al. ....................... 324/96 X Primary Examiner—David C. Nelms
Assistant Examiner—Darwin R. Hostetter
Attorney, Agent, or Firm—Warren D. Hill

[57] ABSTRACT

To detect a change of current flow in a conductor, a current transformer is coupled to the conductor for generating a voltage corresponding to the rate of current change. A liquid crystal device is connected to the transformer and its optical state changes when the transformer generates a voltage. The liquid crystal device is incorporated in a fiber optic circuit illuminated at one end for controlling the light emission from the other end. If the monitored circuit carries direct current, the light emission will change state briefly when the current is turned on and off or makes other rapid changes. Where the monitored circuit carries alternating current, the emitted light will be on or off depending on whether the alternating current is on or off.

4 Claims, 5 Drawing Figures

REMOTE CURRENT SENSOR

This invention relates to a current sensor and more particularly to an electro-optical current sensor.

It is often desirable to monitor the existence of current flow in electrical circuits during their ordinary use or during testing without interfering with the integrity of the circuit and having the capability of indicating or displaying the monitored current condition at a location remote from the monitored circuits. Some problems which have arisen in attempts to monitor current in a circuit are electrical power requirement of the monitoring instrument at the location of the monitored circuit and electromagnetic interference which gives spurious results by developing false signals in the monitoring circuit.

It is, therefore, an object of this invention to provide a current monitor which requires no electrical power at the site of the monitored circuit and which is substantially immune from electromagnetic interference. A further object of the invention is to provide such a current sensor which does not violate the integrity of the circuit being monitored and which provides an output at a remote location.

The invention is carried out by a current transformer for coupling to the circuit being monitored to generate a voltage in response to instantaneous current change in the monitored circuit, a liquid crystal device connected to the current transformer output for changing state optically when the transformer generates a voltage and a light source for illuminating the liquid crystal device. The invention further contemplates that the light supplied to the liquid crystal device and received from the liquid crystal device be conducted by fiber optics to and from a remote location so that the modulation due to changing current flow can be observed or electronically analyzed.

The above and other advantages will be made more apparent from the following specification taken in conjunction with the accompanying drawings wherein like reference numerals refer to like parts and wherein.

Figure 1:
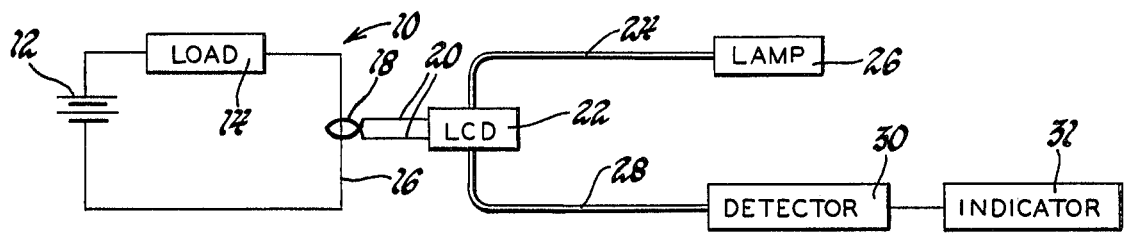
FIG. 1 is a schematic diagram of a remote current sensor according to the invention.

Referring to FIG. 1, a monitored electrical circuit 10 comprises a DC source such as a battery 12 coupled to a load 14 by conductors 16. A current transformer 18 is inductively coupled to the conductor 16 for generating an output voltage on lines 20 according to the rate of current change whenever the current in the conductor 16 changes. The conductor 16 thus serves as the transformer primary. The conductors 20 are connected to a liquid crystal device (LCD) 22 which, as is well known, changes its optical state upon application of a voltage thereto. For example, if the LCD is normally opaque it becomes transparent to light when a voltage is applied thereto. Alternatively, the LCD may be normally transparent and become opaque when the voltage is applied thereto. In either case, the LCD is a field effect device and draws substantially no current from the transformer 18. Thus, the current transformer does not load the circuit 10 or otherwise interfere with its operation.

A fiber optic light conductor 24 couples light from a lamp 26 to one side of the LCD and a similar light conductor 28 couples light from the LCD to a detector 30. The detector 30 is a circuit including a light sensitive electronic device such as a phototransistor which electrically responds to the light emitted from the light conductor 28. The light from lamp 26 is not limited to visible light but may, for example, be infrared or ultraviolet radiation. The detector output is fed to an indicator 31 which provides a visual or audible output. The lamp and detector can be located remotely from the LCD by use of long lengths of fiber optic light conductors 24 and 28. Thus, the portion of the sensor in the vicinity of the circuit 10 requires no external circuit connection. That is, there is no power supply connection needed for the current transformer 18 and the LCD 22. By keeping the leads 20 very short, any electromagnetic interference is minimized so that spurious signals are not produced. The long light conductors 24 and 28, of course, are immune to the electromagnetic interference. The LCD has been described as a controllable light transmissive device but a reflective type of LCD can be used as well to modulate light passage between the light conductors 24 and 28. In any event, the LCD serves as a light shutter controlled by the voltage output of the current transformer 18.

Figure 2:
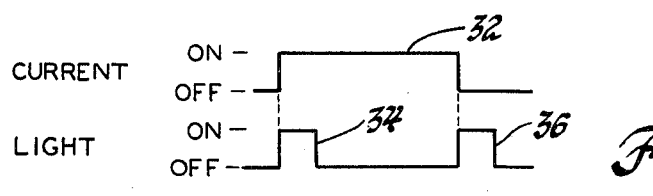
FIG. 2 is a pair of waveforms which illustrate the operation of the current sensor of FIG. 1.

The operation of the sensor as thus far described is illustrated in FIG. 2 where the waveform 32 represents the DC current flowing in the conductor 16 and the waveforms 34 and 36 represent the light output of the light conductor 28. When the current is turned on, the transformer 18 produces a voltage pulse which switches on the LCD 22 or renders it transparent momentarily to produce the light pulse 34. When the current in conductor 16 turned off again, the transformer 18 generates a voltage pulse and a corresponding light pulse 36 is produced. Of course, depending on the type of LCD utilized, the light can be normally on, then the pulses 34 and 36 would represent dark intervals. In any event, the detector 30 senses the pulses 34 and 36 and produces an output which can be used to trigger an indicator 31 or an alarm which simply reveals that a current change in circuit 10 has occurred.

Figure 3:
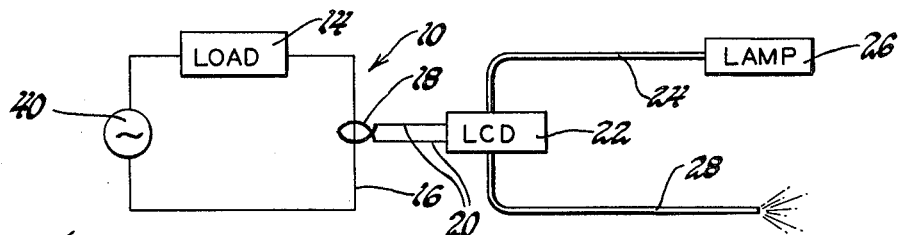
FIG. 3 is a schematic diagram of a second embodiment of the current sensor according to the invention.
Figure 4:
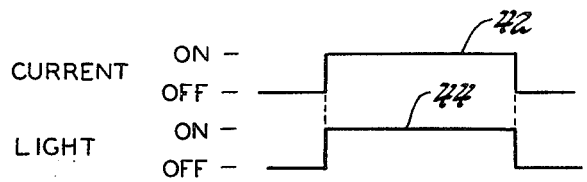
FIG. 4 is a pair of waveforms illustrating the operation of the current sensor of FIG. 3.

FIG. 3 illustrates a monitored circuit 10 having an alternating current source 40. Since alternating current is constantly changing current flow, the transformer 18 is always generating a voltage whenever the AC current is on. Thus, the LCD 22 is constantly energized when the current is on so that if the LCD is normally opaque, light is emitted from the light conductor 28 whenever the AC current in conductor 16 is turned on. The light emission from the light conductor 28 alone may be used to illuminate a telltale signal or a legend to provide a readout at a location remote from the monitored circuit 10. The correspondence of the AC current flow and the emitted light is shown in FIG. 4 wherein the waveform 42 represents the AC current flow in the conductor 16 and the waveform 44 shows the corresponding light emission from the light conductor 28.

Figure 5:
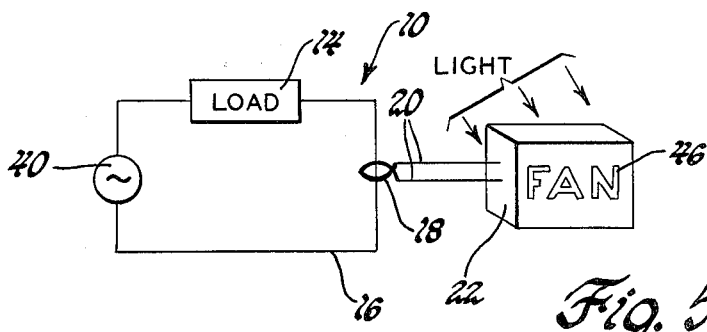
FIG. 5 is a schematic diagram of a third embodiment of the current sensor according to the invention.

FIG. 5 illustrates still in another embodiment wherein the monitored circuit 10 has an AC source like that of FIG. 3. The current transformer 18 is connected to the LCD 22 as before. The LCD is illuminated by any desired means and it is formed with a legend 46 on its face which provides a readout indication when the LCD 22 is energized. In this embodiment the fiber optic light conductors 24 and 28 are dispensed with and if the LCD 22 is placed remotely from the circuit 10, then the transformer output leads 20 will be long enough to pick up electromagnetic interference. Thus, the embodiment of FIG. 5 requires conductor shielding to ensure immunity to interference but has the advantage of not requiring the fiber optic conductors 24 and 28. Alternatively, if the leads 20 are kept short, the LCD 22 can be used as a local rather than a remote readout for the sensor.

It will thus be seen that the current sensor according to this invention provides a device for remotely indicating the change of current flow in a conductor and requires no external power to be fed to the location of the conductor. Further, it is apparent that the current sensor is subject to many embodiments and various applications only a few of which are described herein but which fall within the spirit of the invention.

The embodiments of the invention in which an exclusive property or privilege is claimed are defined as follows:

1. A remote current sensor for detecting the change of current flow in a conductor comprising
    a current transformer coupled to a current-carrying conductor for generating a voltage corresponding to change of current flow,
    a liquid crystal device electrically connected to the transformer and having an optical characteristic variable in response to the generated voltage, and
    optical readout means coupling radiant energy to the liquid crystal device for modulation thereby for producing a signal corresponding to the change of current flow.

2. A remote current sensor for detecting the change of current flow in a conductor comprising
    a current transformer coupled to a current-carrying conductor for generating a voltage corresponding to change of current flow,
    a liquid crystal device electrically connected to the transformer and serving as an optical shutter for selectively transmitting and blocking light in response to the generated voltage,
    a light source, and
    fiber optic light conductor means coupling light energy from the light source to the liquid crystal device for modulation thereby for producing a signal corresponding to the change of current flow.

3. A remote current sensor for detecting the change of current flow in a conductor comprising
    a current transformer coupled to a current-carrying conductor for generating a voltage corresponding to change of current flow,
    a liquid crystal device electrically connected to the transformer and having an optical characteristic variable in response to the generated voltage,
    a light source,
    fiber optic means coupling light from the light source to the liquid crystal device for modulation thereby for producing a light signal corresponding to the change of current flow, and
    light sensitive electronic means connected to the fiber optical means at a location remote from the conductor and responsive to the light signal for detecting the light signal and producing an electrical signal representing the change of current flow.

4. A remote current sensor for detecting the change of direct current flow in a conductor comprising
    a current transformer coupled to a current-carrying conductor for generating a voltage pulse corresponding to starting or stopping the direct current flow,
    a liquid crystal device electrically connected to the transformer and serving as an optical shutter for switching light transmission states by selectively transmitting and blocking light in response to the generated voltage,
    a light source, and
    optical readout means coupling light to the liquid crystal device for modulation thereby for producing a brief change of light transmission state upon starting or stopping direct current flow.

* * * * *